(12) United States Patent
Morohashi et al.

(10) Patent No.: US 11,322,192 B2
(45) Date of Patent: May 3, 2022

(54) APPARATUSES AND METHODS FOR CALCULATING ROW HAMMER REFRESH ADDRESSES IN A SEMICONDUCTOR DEVICE

(71) Applicant: Micron Technology, Inc., Boise, ID (US)

(72) Inventors: Masaru Morohashi, Hachioji (JP); Hidekazu Noguchi, Shinjuku-ku (JP)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 16/805,197

(22) Filed: Feb. 28, 2020

(65) Prior Publication Data

US 2020/0202921 A1    Jun. 25, 2020

Related U.S. Application Data

(63) Continuation of application No. 15/876,566, filed on Jan. 22, 2018, now Pat. No. 10,580,475.

(51) Int. Cl.

| | | |
|---|---|---|
| *G06F 13/00* | (2006.01) | |
| *G11C 11/406* | (2006.01) | |
| *G11C 15/04* | (2006.01) | |
| *G11C 8/10* | (2006.01) | |
| *G06F 13/16* | (2006.01) | |
| *G11C 16/34* | (2006.01) | |

(52) U.S. Cl.
CPC .... *G11C 11/40615* (2013.01); *G06F 13/1636* (2013.01); *G11C 8/10* (2013.01); *G11C 11/40611* (2013.01); *G11C 11/40622* (2013.01); *G11C 15/04* (2013.01); *G11C 16/349* (2013.01)

(58) Field of Classification Search
None
See application file for complete search history.

(56) References Cited

U.S. PATENT DOCUMENTS

| | | |
|---|---|---|
| 1,158,364 A | 10/1915 | Bibb |
| 3,633,175 A | 1/1972 | Harper |
| 5,291,198 A | 3/1994 | Dingwall et al. |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

International Search Report and Written Opinion for PCT/US2020/017019 dated Jun. 9, 2020.

(Continued)

*Primary Examiner* — Midys Rojas
(74) *Attorney, Agent, or Firm* — Dorsey & Whitney LLP

(57) ABSTRACT

An example apparatus according to an aspect of the present disclosure includes an address scrambler circuit including a sub-wordline scrambler circuit configured to receive a first subset of bits of a row hammer hit address. The sub-wordline scrambler circuit is configured to perform a first set of logical operations on the first subset of bits to provide a second subset of bits, and to perform a second set of logical operations on the first subset of bits and the second subset of bits to provide a third subset of bits of an row hammer refresh address.

18 Claims, 9 Drawing Sheets

(56) References Cited

U.S. PATENT DOCUMENTS

| | | |
|---|---|---|
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,187,607 B2 | 3/2007 | Koshikawa et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,830,742 B2 | 11/2010 | Han |
| 8,451,677 B2 | 5/2013 | Okahiro et al. |
| 8,625,360 B2 | 1/2014 | Iwamoto et al. |
| 8,681,578 B2 | 3/2014 | Narui |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,139 B2 | 11/2015 | Jung et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,741,409 B2 | 8/2017 | Jones et al. |
| 9,741,447 B2 | 8/2017 | Akamatsu |
| 9,747,971 B2 | 8/2017 | Bains et al. |
| 9,786,351 B2 | 10/2017 | Lee et al. |
| 9,799,391 B1 | 10/2017 | Wei |
| 9,805,782 B1 | 10/2017 | Liou |
| 9,805,783 B2 * | 10/2017 | Ito ........................ G11C 29/846 |
| 9,818,469 B1 | 11/2017 | Kim et al. |
| 9,847,118 B1 | 12/2017 | Won |
| 9,865,326 B2 | 1/2018 | Bains et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,134,461 B2 | 11/2018 | Bell et al. |
| 10,147,472 B2 | 12/2018 | Jones et al. |
| 10,153,031 B2 | 12/2018 | Akamatsu |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,387,276 B2 | 8/2019 | Ryu et al. |
| 10,446,216 B2 | 10/2019 | Oh et al. |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,373 B2 | 10/2021 | Penney et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0041502 A1 | 2/2005 | Perner |
| 2005/0243629 A1 | 11/2005 | Lee |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0030746 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0316845 A1 | 12/2008 | Wang et al. |
| 2009/0077571 A1 | 3/2009 | Gara et al. |
| 2009/0161457 A1 | 6/2009 | Wakimoto |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0074042 A1 | 3/2010 | Fukuda et al. |

(56) References Cited

U.S. PATENT DOCUMENTS

| | | |
|---|---|---|
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0069572 A1 | 3/2011 | Lee et al. |
| 2011/0122987 A1 | 5/2011 | Neyer |
| 2011/0216614 A1 | 9/2011 | Hosoe |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0279284 A1 | 10/2013 | Jeong |
| 2013/0304982 A1 | 11/2013 | Jung et al. |
| 2014/0006704 A1 | 1/2014 | Greenfield et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0136763 A1 | 5/2014 | Li et al. |
| 2014/0177370 A1 | 6/2014 | Halbert et al. |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0317344 A1 | 10/2014 | Kim |
| 2014/0355332 A1 | 12/2014 | Youn et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0089326 A1 | 3/2015 | Joo et al. |
| 2015/0155027 A1 | 6/2015 | Abe et al. |
| 2015/0170728 A1 | 6/2015 | Jung et al. |
| 2015/0206572 A1 | 7/2015 | Lim et al. |
| 2015/0213877 A1 | 7/2015 | Darel |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0340077 A1 | 11/2015 | Akamatsu |
| 2016/0019940 A1 | 1/2016 | Jang et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225461 A1 | 8/2016 | Tuers et al. |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0139641 A1 | 5/2017 | Cha et al. |
| 2017/0140811 A1 | 5/2017 | Joo |
| 2017/0213586 A1 | 7/2017 | Kang et al. |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0025770 A1 | 1/2018 | Ito et al. |
| 2018/0060194 A1 | 3/2018 | Ryu et al. |
| 2018/0084314 A1 | 3/2018 | Koyama |
| 2018/0090199 A1 | 3/2018 | Kim et al. |
| 2018/0114561 A1 | 4/2018 | Fisch et al. |
| 2018/0158504 A1 | 6/2018 | Akamatsu |
| 2018/0203621 A1 | 7/2018 | Ahn et al. |
| 2018/0218767 A1 | 8/2018 | Wolff |
| 2018/0294028 A1 | 10/2018 | Lee et al. |
| 2018/0308539 A1 | 10/2018 | Ito et al. |
| 2018/0366182 A1 | 12/2018 | Hyun et al. |
| 2019/0013059 A1 | 1/2019 | Akamatsu |
| 2019/0051344 A1 | 2/2019 | Bell et al. |
| 2019/0066759 A1 | 2/2019 | Nale |
| 2019/0066762 A1 | 2/2019 | Koya |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0172518 A1 | 6/2019 | Chen et al. |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0267077 A1 | 8/2019 | Ito et al. |
| 2019/0333573 A1 | 10/2019 | Shin et al. |
| 2019/0348100 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385667 A1 | 12/2019 | Morohashi et al. |
| 2019/0386557 A1 | 12/2019 | Wang et al. |
| 2020/0075106 A1 | 3/2020 | Tokutomi et al. |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |

(56) References Cited

U.S. PATENT DOCUMENTS

| | | | |
|---|---|---|---|
| 2021/0057021 | A1 | 2/2021 | Wu et al. |
| 2021/0065755 | A1 | 3/2021 | Kim et al. |
| 2021/0065764 | A1 | 3/2021 | Cheng et al. |
| 2021/0142852 | A1 | 5/2021 | Schreck et al. |
| 2021/0158851 | A1 | 5/2021 | Ayyapureddi et al. |
| 2021/0158860 | A1 | 5/2021 | Wu et al. |
| 2021/0158861 | A1 | 5/2021 | Jeong et al. |
| 2021/0201984 | A1 | 7/2021 | Khasawneh et al. |
| 2021/0225432 | A1 | 7/2021 | Enomoto et al. |
| 2021/0241810 | A1 | 8/2021 | Hollis et al. |
| 2021/0265504 | A1 | 8/2021 | Ishizu et al. |
| 2021/0343324 | A1 | 11/2021 | Brown et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| JP | H0773682 A | 3/1995 |
| JP | 2005-216429 A | 8/2005 |
| JP | 2011-258259 A | 12/2011 |
| JP | 2013-004158 A | 1/2013 |
| KR | 20170058022 A | 5/2017 |
| KR | 1020180064940 A | 6/2018 |
| KR | 1020180085184 A | 7/2018 |
| WO | 2014120477 A | 8/2014 |
| WO | 2015030991 A1 | 3/2015 |
| WO | 2017171927 A1 | 10/2017 |
| WO | 2020191222 A1 | 9/2020 |

OTHER PUBLICATIONS

International Search Report/Written Opinion dated Jul. 8, 2020 for PCT Application No. PCT/US2020/023689, 12 pgs.
KR Office Action dated Sep. 11, 2020 for KR Application No. 10-2018-7030487.
U.S. Appl. No. 16/936,297 titled "Apparatuses and Methods for Managing Row Access Counts", filed Jul. 22, 2020.
Thomas, et al., "Voltage Source Based Voltage-to-Time Converter", IEEE, 2020, p. All.
ISR/WO dated Oct. 26, 2020 for PCT Application No. PCT/US2020/040077.
U.S. Appl. No. 17/102,266, titled "Apparatuses and Methods for Tracking Word Line Accesses", dated Nov. 23, 2020.
Exam Report for Application No. 16200792.6, dated Nov. 14, 2019.
First Office Action for Taiwanese Application No. 105134192, dated Nov. 20, 2017.
International Search Report and Written Opinion for PCT Appl. No. PCT/US2016/037673 dated Jun. 18, 2019.
International Search Report and Written Opinion for PCT/US2014/049357 dated Nov. 12, 2014.
Receipt of 1st Office Action for KR Appln No. 10-2015-7023825 dated Dec. 5, 2016.
Second Office Action for EP Application No. 16200792.6 dated Mar. 5, 2019.
U.S. Appl. No. 16/546,152 titled "Apparatuses and Methods for Analog Row Access Tracking", filed Aug. 20, 2019.
U.S. Appl. No. 16/548,027 titled "Apparatuses, Systems, and Methods for Analog Row Access Rate Determination", filed Aug. 22, 2019.
U.S. Appl. No. 16/549,942 titled "Apparatuses and Methods for Lossy Row Access Counting", filed Aug. 23, 2019.
U.S. Appl. No. 16/797,658, titles "Apparatuses and Methods for Controlling Refresh Operations".
U.S. Appl. No. 16/425,525 titled "Apparatuses And Methods For Tracking All Row Accesses", filed May 29, 2019.
U.S. Appl. No. 16/427,105 titled "Apparatuses And Methods For Priority Targeted Refresh Operations", filed May 30, 2019.
U.S. Appl. No. 16/427,140 titled "Apparatuses And Methods For Tracking Row Access Counts Between Multiple Register Stacks", filed May 30, 2019.
U.S. Appl. No. 16/437,811 titled "Apparatuses, Systems, And Methods For Determining Extremum Numerical Values", filed Jun. 11, 2019.
U.S. Appl. No. 16/012,679, titled "Apparatuses and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/112,471 titled "Apparatuses and Methods for Controlling Refresh Operations", filed Aug. 24, 2018.
U.S. Appl. No. 16/160,801, titled "Apparatuses and Methods for Selective Row Refreshes", filed Oct. 15, 2018, pp. all.
U.S. Appl. No. 16/231,327 titled "Apparatuses and Methods for Selective Row Refreshes", filed Dec. 21, 2018.
U.S. Appl. No. 16/268,818, titled "Apparatuses and Methods for Managing Row Access Counts", filed Feb. 6, 2019.
U.S. Appl. No. 16/358,587, titled "Semiconductor Device Having Cam That Stores Address Signals", dated Mar. 19, 2019.
U.S. Appl. No. 16/411,698 title "Semiconductor Device", filed May 14, 201.
U.S. Appl. No. 16/427,330 titled "Apparatuses and Methods for Storing Victim Row Data", filed May 30, 2019.
U.S. Appl. No. 16/428,625 titled "Apparatuses and Methods for Tracking Victim Rows", filed May 31, 2019.
U.S. Appl. No. 15/876,566 entitled 'Apparatuses and Methods for Calculating Row Hammer Refresh Addresses in a Semiconductor Device', filed Jan. 22, 2018.
U.S. Appl. No. 15/656,084 Titled: Apparatuses And Methods For Targeted Refreshing Of Memory, filed Jul. 21, 2017.
U.S. Appl. No. 15/715,846, entitled "Semiconductor Device", filed Sep. 26, 2017.
U.S. Appl. No. 15/888,993, entitled "Apparatuses and Methods for Controlling Refresh Operations", filed Feb. 5, 2018.
U.S. Appl. No. 16/190,627 titled "Apparatuses and Methods for Targeted Refreshing of Memory", filed Nov. 14, 2018.
U.S. Appl. No. 16/459,520 titled "Apparatuses and Methods for Monitoring Word Line Accesses", filed Jul. 1, 2019.
"EP Search Report for app. # 16200792.6 dated Feb. 22, 2017".
"First Office Action received for Application No. 103103005 dated Sep. 17, 2015".
"International Search Report & Written Opinion for Appln No. PCT/US2014/012007 dated May 8, 2014".
"International Search Report and Written Opinion for PCT Appl. No. PCT/US2016/54878 dated Jan. 19, 2017".
"Received 1st Office Action dated Jan. 26, 2017 for CN.01 Application No. 201480007334.X".
"Supplemental Partial European Search Report for Appl. No. 14745923.4 dated Sep. 28, 2016".
"TW Office Action dated Nov. 26, 2015 for TW appl No. 103127973".
U.S. Appl. No. 15/281,818, entitled: "Semiconductor Device", filed Sep. 30, 2016.
Kim, et al., "Flipping Bits in MemoryWithout Accessing Them: An Experimental Study of DRAM Disturbance Errors", IEEE, Jun. 2014, 12 pgs.
U.S. Appl. No. 16/513,400 titled "Apparatuses and Methods for Tracking Row Accesses", filed Jul. 16, 2019.
English translatio of CN Office Action for Application No. 201611197820.X, dated Apr. 3, 2020.
English translation of Notice of Preliminary Rejection for KR Application No. 10-2018-7030487, dated Mar. 19, 2020.
U.S. Appl. No. 17/153,555 titled "Apparatuses and Methods For Dynamically Allocated Aggressor Detection", filed Jan. 20, 2021.
U.S. Appl. No. 17/154,945 titled "Apparatuses, Systems, and Methods for a Content Addressable Memory Cell", filed Jan. 21, 2021.
U.S. Appl. No. 17/168,036 titled "Apparatuses and Methods for Analog Row Access Tracking", filed Feb. 4, 2021.
U.S. Appl. No. 17/170,616 titled "Apparatuses, Systems, and Methods for Analog Row Access Rate Determination", filed Feb. 8, 2021.

(56) References Cited

OTHER PUBLICATIONS

U.S. Appl. No. 17/201,941 titled "Apparatuses and Methods for Sketch Circuits for Refresh Binning", filed Mar. 15, 2021.
U.S. Appl. No. 17/301,533 titled "Semiconductor Device Having Cam That Stores Address Signals", filed April 6. 2021.
U.S. Appl. No. 16/459,507 titled "Apparatuses and Methods for Adjusting Victim Data", filed Jul. 1, 2019, pp. all.
U.S. Appl. No. 17/007,069 titled "Apparatuses and Methods for Providing Refresh Addresses", filed Aug. 31, 2020.
U.S. Appl. No. 17/375,817 titled "Apparatuses and Methods for Monitoring Word Line Accesses", filed Jul. 14, 2021.
U.S. Appl. No. 17/443,056 titled "Apparatuses and Methods for Multiple Row Hammer Refresh Address Sequences", filed Jul. 20, 2021.
U.S. Appl. No. 17/470,883 titled "Apparatuses and Methods for Tracking Victim Rows", filed Sep. 9, 2021.
U.S. Appl. No. 17/444,925 titled "Apparatuses and Methods for Countering Memory Attacks", filed Aug. 12, 2021.
U.S. Appl. No. 17/446,710 titled "Apparatuses, Systems, and Methods for Determining Extremum Numericalvalues", filed Sep. 1, 2021.
U.S. Appl. No. 17/456,849 titled "Apparatuses, Systems, and Methods for Main Sketch and Slim Sketch Circuitfor Row Address Tracking" filed Nov. 29, 2021.
U.S. Appl. No. 17/565,119 titled "Apparatuses and Methods for Row Hammer Counter Mat" filed Dec. 29, 2021.
U.S. Appl. No. 17/565,187 titled "Apparatuses and Methods for Row Hammer Counter Mat" filed Dec. 29, 2021.

\* cited by examiner

FIG. 4B

1st RHR scramble
Seed Address Xor b'0001

2nd RHR scramble  ← 402D
X3 = !((A0^A1^A3)||(A2^A1))

← 402C
X2 = !((A0^A1^A3)||(A2^A1))

← 402B
X1 = (A0^A1^A3)||(A2^A1)

← 402A
X0=1

| A2 | A1 | A0 | A3=0 | A3=1 |
|----|----|----|------|------|
| 0  | 0  | 0  |      | 0    |
| 0  | 0  | 1  | 0    |      |
| 0  | 1  | 0  | 0    | 0    |
| 0  | 1  | 1  | 0    | 0    |
| 1  | 0  | 0  | 0    | 0    |
| 1  | 0  | 1  | 0    | 0    |
| 1  | 1  | 0  | 0    |      |
| 1  | 1  | 1  |      | 0    |

| A2 | A1 | A0 | A3=0 | A3=1 |
|----|----|----|------|------|
| 0  | 0  | 0  | 0    | 0    |
| 0  | 0  | 1  | 0    | 0    |
| 0  | 1  | 0  | 0    |      |
| 0  | 1  | 1  | 1    | 0    |
| 1  | 0  | 0  |      | 0    |
| 1  | 0  | 1  | 0    |      |
| 1  | 1  | 0  | 0    | 0    |
| 1  | 1  | 1  | 0    | 0    |

| A2 | A1 | A0 | A3=0 | A3=1 |
|----|----|----|------|------|
| 0  | 0  | 0  | 0    |      |
| 0  | 0  | 1  |      | 0    |
| 0  | 1  | 0  |      |      |
| 0  | 1  | 1  |      |      |
| 1  | 0  | 0  |      |      |
| 1  | 0  | 1  |      |      |
| 1  | 1  | 0  |      | 0    |
| 1  | 1  | 1  | 0    |      |

APPARATUSES AND METHODS FOR CALCULATING ROW HAMMER REFRESH ADDRESSES IN A SEMICONDUCTOR DEVICE

CROSS-REFERENCE TO RELATED APPLICATION(S)

This application is a continuation of U.S. patent application Ser. No. 15/876,566 filed on Jan. 22, 2018, issued as U.S. Pat. No. 10,580,475 on Mar. 3, 2020. This application and patent are incorporated by reference herein in their entirety and for all purposes.

BACKGROUND

A dynamic random access memory (DRAM), which is a typical semiconductor memory device, stores information by charges accumulated in cell capacitors, and, therefore, the information is lost unless refresh operations are periodically carried out. In addition to normal memory cell retention characteristics, as the density of DRAM cells has increased, certain access patters may further reduce retention time, thereby leading to data becoming corrupted. Such a problem has been exposed in DRAM devices, by repeatedly accessing (i.e., hammering) a row of memory, commonly referred to as a row hammer. A row hammer causes adjacent rows of memory become susceptible to accelerated loss of data, as compared with a normal access operation of the memory. Some conventional solutions have been implemented to detect a likely row hammer of a target row, and initiate a refresh of rows that are adjacent to the target row. Conventional solutions are complex and require extensive circuitry to implement.

BRIEF DESCRIPTION OF THE DRAWINGS

FIGS. 4A-4C are block diagrams showing logical relationships between physical and logical addresses in accordance with an embodiment of the disclosure.

DETAILED DESCRIPTION OF PREFERRED EMBODIMENTS

Hereinafter, some embodiments of the present disclosure will be described in detail with reference to accompanying drawings.

Figure 1:
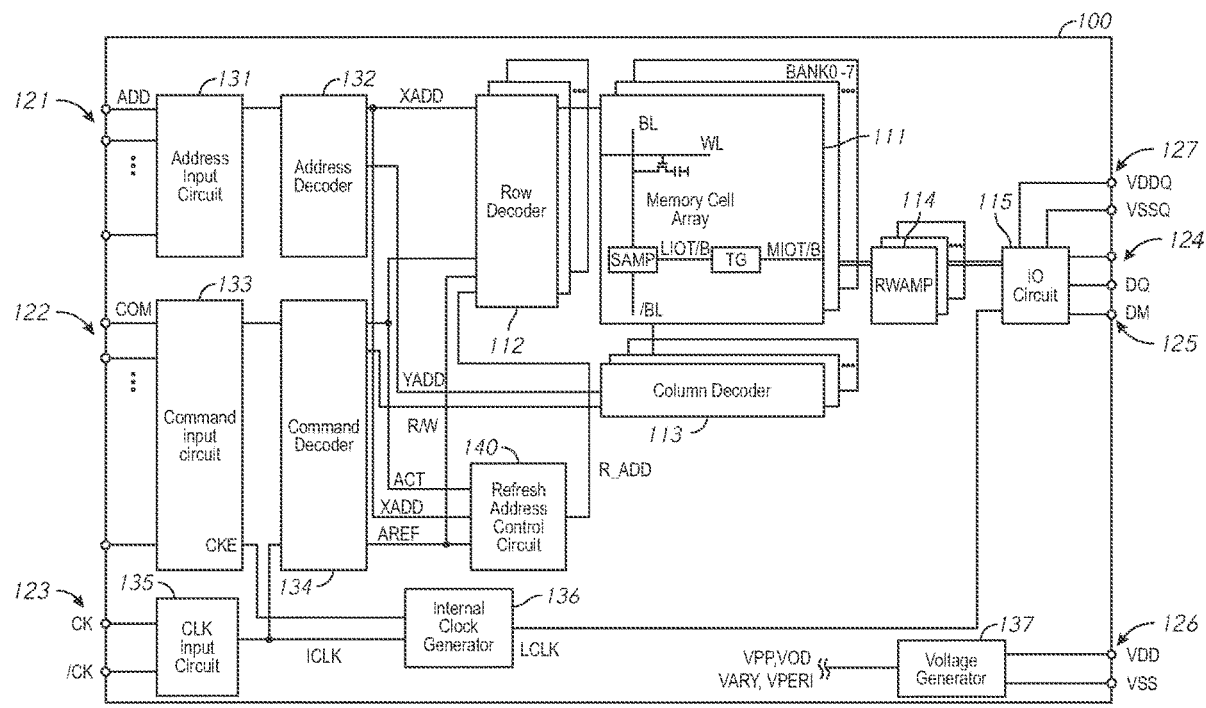
FIG. 1 is a block diagram showing an overall configuration of a semiconductor device 100 in accordance with some embodiments of the disclosure.

FIG. 1 is a block diagram showing an overall configuration of a semiconductor device 100 in accordance with some embodiments of the present disclosure.

The semiconductor device 100 may be a synchronous DRAM (SDRAM) for some embodiments of the disclosure, for example, a Double Data Rate 3 (DDR3), a Double Data Rate 4 (DDR4), etc., type integrated on a single semiconductor chip and has a memory cell array 111. The memory cell array 111 is provided with a plurality of word lines WL and a plurality of bit lines BL and has a configuration in which memory cells MC are disposed at the intersection points thereof. Selection of the word lines WL is carried out by a row decoder 112, and selection of bit lines BL is carried out by a column decoder 113. The memory cell array 111, the row decoder 112, the column decoder 113, and a read/write amplifier 114 are divided into eight banks BANK0 to BANK7.

Moreover, the semiconductor device 100 is provided with address terminals 121, command terminals 122, clock terminals 123, data terminals 124, data mask terminals 125, and power supply terminals 126 and 127 as external terminals.

The address terminals 121 are the terminals to which address signals ADD are input from outside. The address signals ADD are supplied to an address output circuit 132 via an address input circuit 131. The address output circuit 132 supplies a row address XADD to the row decoder 112 and supplies a column address YADD to the column decoder 113. Moreover, the row address XADD is supplied also to a refresh address control circuit 140.

The command terminals 122 are the terminals to which command signals COM are input from outside. The command signals COM are supplied to a command decoder 134 via a command input circuit 133. The command decoder 134 is a circuit which generates various internal commands by decoding the command signals COM. Examples of the internal commands include active signals ACT, pre-charge signals Pre, read/write signals R/W, and refresh signals AREF.

The active signal ACT is a pulse signal which is activated when the command signal COM is indicating row access (active command). When the active signal ACT is activated, the row decoder 112 of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 112 of the specified bank address and the word line WL specified by the row address XADD controlled thereby are deactivated.

The read/write signal R/W is a pulse signal which is activated when the command signal COM is indicating column access (read command or write command). When the read/write signal R/W is activated, the column decoder 113 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 124 to outside via a sense amplifier SAMP, a transfer gate TG, the read/write amplifier 114, and an input/output circuit 115.

On the other hand, if the active command and the write command are input, if the row address XADD and the column address YADD are input in synchronization with them, and, then, if write data DQ is input to the data terminal 124, the write data DQ is supplied to the memory cell array 111 via the input/output circuit 115, the read/write amplifier 114, the transfer gate TG, and the sense amplifier SAMP and is written to the memory cell MC specified by the row address XADD and the column address YADD.

The refresh signal AREF is a pulse signal which is activated when the command signal COM is indicating an auto-refresh command. Also, when the command signal COM is indicating a self-refresh entry command, the refresh signal AREF is activated, is activated once immediately after command input, thereafter, is cyclically activated at desired internal timing, and a refresh state is continued. By a self-refresh exit command thereafter, the activation of the refresh signal AREF is stopped and returns to an IDLE state. The refresh signal AREF is supplied to the refresh address control circuit 140. The refresh address control circuit 140 supplies a refreshing row address RXADD to the row decoder 112, thereby activating the predetermined word line WL contained in the memory cell array 111, thereby refreshing the information of the corresponding memory cell MC. Other than the refresh signal AREF, the active signal ACT, the row address XADD, etc. are supplied to the refresh address control circuit 140. Details of the refresh address control circuit 140 will be described later.

External clock signals CK and /CK are input to the clock terminals 123. The external clock signals CK and the external clock signals /CK are mutually complementary signals, and both of them are supplied to the clock input circuit 135. The clock input circuit 135 generates internal clock signals ICLK based on the external clock signals CK and /CK. The internal clock signals ICLK are supplied to the command decoder 134, an internal clock generator 136, etc. The internal clock generator 36 generates internal clock signals LCLK, which control the operation timing of the input/output circuit 115.

The data mask terminals 125 are the terminals to which data mask signals DM are input. When the data mask signal DM is activated, overwrite of corresponding data is prohibited.

The power supply terminals 126 are the terminals to which power supply potentials VDD and VSS are supplied. The power supply potentials VDD and VSS supplied to the power supply terminals 126 are supplied to a voltage generator 37. The voltage generator 137 generates various internal potentials VPP, VOD, VARY, VPERI, etc. based on the power supply potentials VDD and VSS. The internal potential VPP is the potential mainly used in the row decoder 112, the internal potentials VOD and VARY are the potentials used in the sense amplifier SAMP in the memory cell array 111, and the internal potential VPERI is the potential used in many other circuit blocks.

The power supply terminals 127 are the terminals to which power supply potentials VDDQ and VSSQ are supplied. The power supply potentials VDDQ and VSSQ supplied to the power supply terminals 127 are supplied to the input/output circuit 115. The power supply potentials VDDQ and VSSQ are the same potentials as the power supply potentials VDD and VSS, respectively, which are supplied to the power supply terminals 126. However, the dedicated power supply potentials VDDQ and VSSQ are used for the input/output circuit 115 so that power supply noise generated by the input/output circuit 115 does not propagate to other circuit blocks.

Figure 2:
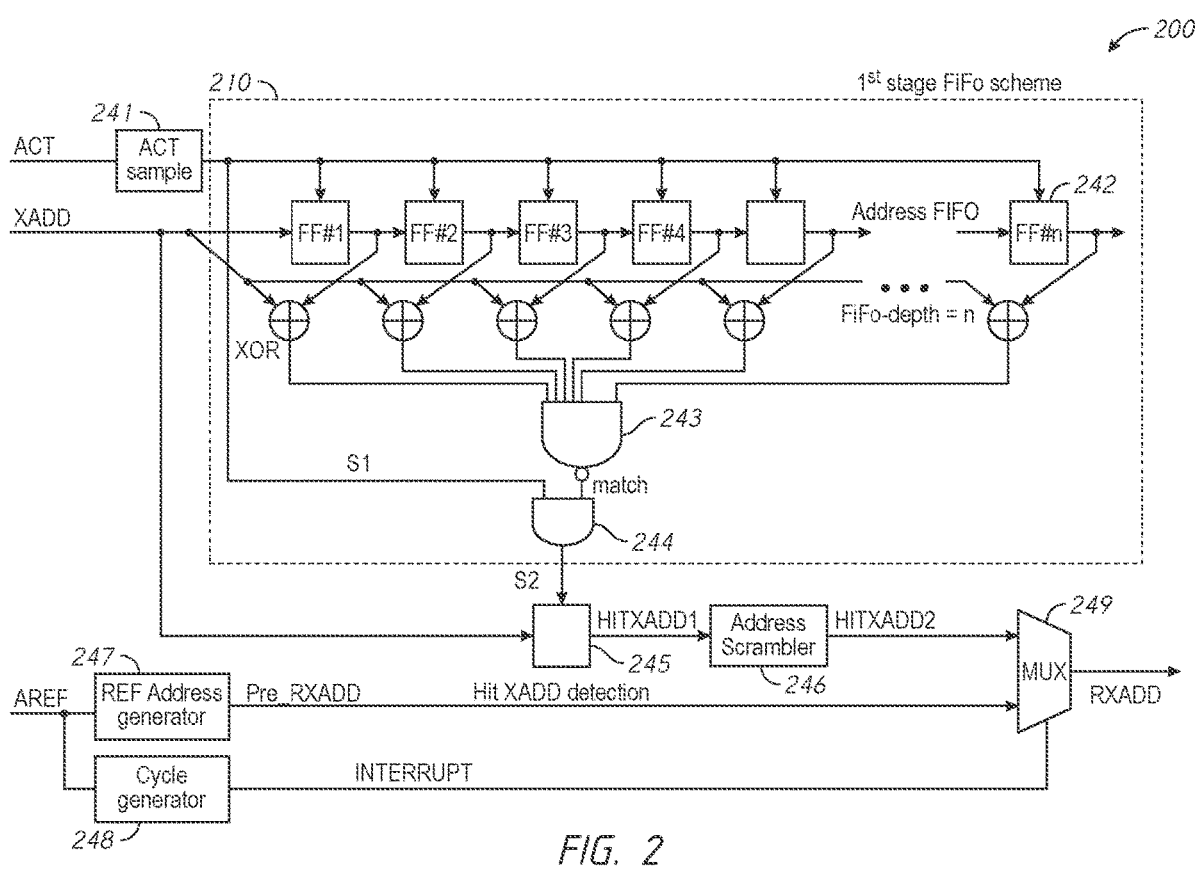
FIG. 2 is a block diagram showing a configuration of a refresh address control circuit in accordance with some embodiments of the disclosure.

FIG. 2 is a block diagram showing a configuration of a refresh address control circuit 200 in accordance with some embodiments of the disclosure. The refresh address control circuit 140 of FIG. 1 may implement the refresh address control circuit 200.

As shown in FIG. 2, the refresh address control circuit 200 is provided with a sampling signal generator 241, which generates a first sampling signal S1, and a shift register 242, which carries out shift operations synchronized with the first sampling signal S1.

The sampling signal generator 241 randomly extracts the active signal ACT or the pre-charge signal Pre, which is generated in response to an active command or a pre-charge command, and outputs the signal as a first sampling signal S1. Meanwhile, the random extraction is configured so that an optimum sampling rate with which the reliability of Row Hammer refresh is the highest is present depending on the appearance frequency of hammer addresses and the number of stages (depth) of the shift register 42 and that desired reliability is obtained. The sampling signal generator 241 can generate the first sampling signal S1 by: using a pseudo-random generator 411 and a counter circuit, which may be clocked by, for example, the active signal ACT.

Herein, it may be desirable to impart randomness and support all the appearance patterns of hammer addresses. The optimum sampling rate described above is merely a mean value. For example, a case that a hammer address periodically appears at a rate of one time per 50 active commands and that the depth of the shift register 242 provided in the refresh address control circuit 200 is 4 is taken into consideration. Herein, if the sampling rate of the first sampling signal S1 is 1 (if all the row addresses are to be retrieved into the shift register 242), the number of the retrieved addresses is extremely large, and, therefore, many match signals are generated (by randomly appearing row addresses). Hammer addresses are reliably retrieved into the shift register 242; however, since the window width for capturing row addresses is 4, the matching signal "match" is not enabled by hitting the hammer addresses. Even if the sampling rate is somewhat increased to 2 or 3, this situation is not changed. Meanwhile, if the sampling rate is largely increased to 25 (a fixed value), the window width for capturing row addresses is expanded to 100, and results in a situation in which the match signal may be enabled by hitting the hammer addresses. Also, since there is a relation that the appearance frequency of hammer addresses is exactly two times the sampling rate, the hit rate thereof may become extremely high probability as if synchronization with hammer address has occurred. However, since they have a periodic appearance pattern and a constant sampling rate, hit may never occur as if mis-synchronization has occurred. If the appearance pattern of hammer addresses is random (even with a constant sampling rate), probabilistically, hammer addresses may be hit, but not always. Therefore, it is important to carry out random sampling to enable capturing of the hammer addresses having various appearance patterns. Herein, furthermore, a case in which the sampling rate is 100, which is large, is taken into consideration. The window width for capturing row-address becomes 400, which is eight times the appearance frequency of hammer addresses. The hammer addresses can be captured by carrying out random sampling, and the capture probability thereof (hit rate) can be also increased by providing the shift register 42 like the refresh address control circuit (FIG. 2) of the present embodiment. However, if the sampling rate is excessively increased, the number of times per se of capturing the hammer addresses is reduced since the number of active commands which can be entered within a refresh cycle has an upper limit. This is disadvantageous to increase reliability. Reversely, if the sampling rate is too small, as described above, the number of times of capturing thereof increases; however, the capture probability (hit rate) decreases. Thus, the end reliability is determined by a product of "the hammer's hit rate" and "the number of times of capturing hammer address", therefore, the sampling rate has an optimum value with which reliability is the highest according to the balance of them. In order to exert performance by the refresh address control circuit 200, the first sampling signal S1 is extremely important.

The shift register 242 has a configuration in which n-stages of flip-flop circuits FF #1 to FF #n, which latch the row addresses XADD, are in cascade connection. In other words, an output node of the flip-flop circuit of a former stage is connected to an input node of the flip-flop circuit of a later stage. The first sampling signal S1 is commonly input to clock nodes of the flip-flop circuits FF #1 to FF #n. As a result, when the first sampling signal S1 is activated, the current row address XADD is latched by the flip-flop circuit FF #1 of a first stage, and the row addresses XADD latched by the flip-flop circuits FF #1 to FF #n−1 are respectively shifted to the flip-flop circuits FF #2 to FF #n of next stages. The row address XADD latched by the flip-flop circuit FF #n, which is a last stage, is discarded in response to activation of the first sampling signal S1.

The row addresses XADD latched by the flip-flop circuits FF #1 to FF #n are supplied to first-side input nodes of corresponding comparator circuits XOR1 to XORn, respectively. The current row address XADD is supplied to second-side input nodes of the comparator circuits XOR1 to XORn. As a result, if the current row address XADD matches any of the row addresses XADD latched by the flip-flop circuits FF #1 to FF #n, the output of the comparator circuit XOR1 to XORn thereof is activated to a low level, and, therefore, the match signal Match output from a NAND gate circuit 243 is activated to a high level.

The match signal Match and the first sampling signal S1 are supplied to an AND gate circuit 244. Therefore, if both of the match signal Match and the first sampling signal S1 are activated to the high level, a second sampling signal S2 output from the AND gate circuit 244 is activated to the high level. More specifically, if the row address XADD supplied when the first sampling signal S1 is activated within past n-times matches the row address XADD supplied when the first sampling signal S1 is currently activated, the second sampling signal S2 is activated. In other words, the access to the word lines WL is intermittently monitored, and, if the access to the same word line WL is captured two times or more within a predetermined period of time, the second sampling signal S2 is activated.

The second sampling signal S2 is supplied to a latch circuit 245. The latch circuit 245 latches the current row address XADD in response to the second sampling signal S2 and outputs this to an address scrambler 246 as a row hammer hit address signal HITXADD1.

Therefore, the HITXADD1 address signal output from the latch circuit 245 can be considered to be the row address XADD of the word line WL having a high access frequency. As a matter of course, since the first sampling signal S1 is intermittently activated with respect to the active signal ACT, the row address XADD of the word line WL having a high access frequency is not always latched by the latch circuit 245. However, the higher the access frequency of the row address XADD of the word line WL, the higher the probability thereof of being latched by the latch circuit 245; therefore, the row address XADD of the word line WL which is accessed by an extremely high frequency that reduces the information retention characteristics of the memory cells MC connected to the adjacent word line WL is latched by the latch circuit 245 with an extremely high probability.

Based on the HITXADD1 address signal output from the latch circuit 245, the address scrambler 246 converts that to a row hammer refresh address signal HITXADD2 of the word line WL affected by the highly-frequent access. In other words, if the HITXADD1 address signal is an aggressor address, the HITXADD2 address signal is a victim address. In many cases, the HITXADD2 address signal, which is the victim address, is the address of the word line WL which is adjacent to the word line WL accessed by the HITXADD1 address signal, which is the aggressor address. In some examples, the HITXADD2 address signal may include two separate row addresses; one on each side of the HITXADD1 address signal. In some examples having two separate row addresses, both of the row addresses of the HITXADD2 address may each correspond to a respective word line WL that is directly adjacent (e.g., physically adjacent) to the word line WL accessed by the HITXADD1 address.

The refresh address control circuit 200 further contains a refresh counter 247 and a refresh cycle generator 248. The refresh counter 247 is a circuit which updates a row address Pre_RXADD when the refresh signal AREF is activated. The row address Pre_RXADD is the address of the word line corresponding to the memory cell MC to be refreshed in response to the refresh signal AREF. In some examples, if an INTERRUPT signal generated by the refresh cycle generator 248 is activated, update of the row address Pre_RXADD by the refresh counter 247 is prohibited even if the refresh signal AREF is activated. The INTERRUPT signal may indicate time in which a refresh for a row hammer is performed.

The refresh cycle generator 248 activates the INTERRUPT signal in response to a predetermined times of activation of the refresh signal AREF. For example, the refresh cycle generator 248 may include a counter that uses the refresh signal AREF as a clock synchronization signal to determine when to set the INTERRUPT signal.

The multiplexer 249 receives the HITXADD2 address signal output from the address scrambler 246 and the row address Pre_RXADD output from the refresh counter 247 and outputs either one of them to a row decoder (e.g., the row decoder 112 of FIG. 1) as the row address RXADD of a refresh target. The selection thereof is carried out by the INTERRUPT signal; wherein, if the INTERRUPT signal is deactivated, the row address Pre_RXADD output from the refresh counter 247 is selected; and, if the INTERRUPT signal is activated, the HITXADD2 address signal output from the address scrambler 246 is selected; thereby switching and carrying out a normal refresh and a Row Hammer refresh.

Figure 3:
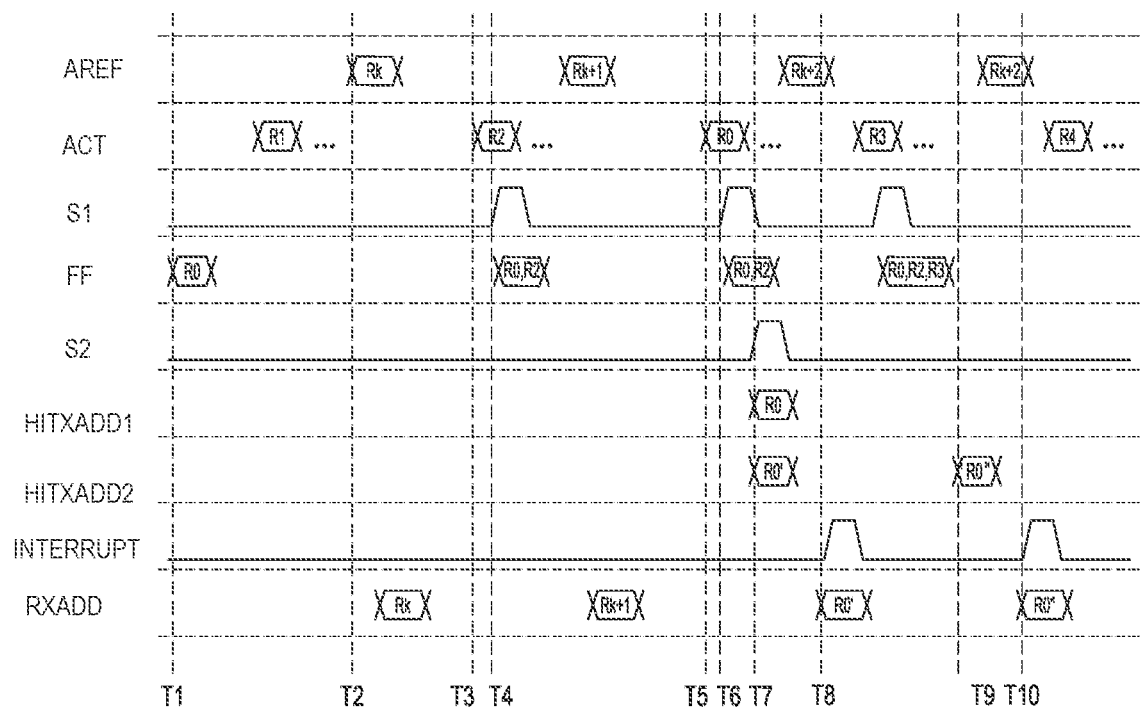
FIG. 3 is an exemplary timing diagram for describing the operations of the refresh address control circuit of FIG. 1 and the refresh address control circuit of FIG. 2.

FIG. 3 is an exemplary timing diagram 300 for describing the operations of the refresh address control circuit 140 of FIG. 1 and the refresh address control circuit 200 of FIG. 2. The AREF, ACT, and RXADD signals correspond to the AREF, ACT, and RXADD signals of FIGS. 1 and 2. The S1, S2, HITXADD1, HITXADD2, and INTERRUPT signals correspond to the S1, S2, HITXADD1, HITXADD2, and INTERRUPT signals of FIG. 2. The flip-flop signal FF corresponds to address stored in the flip-flops of the shifter register 242 of FIG. 2.

In the timing diagram 300, the FF signal indicates that an address R0 was previously stored in the shift register 242, at time T1. Between times T1 and T2, the active signal ACT provides an access request for an address R1. Because the refresh address control circuit sampling is random, the address R1 is not captured and stored in the flip-flops (e.g., because the S1 signal is low). At time T2, a refresh command AREF requests a refresh of address Rk, and address Rk is provided as the refresh address on the RXADD signal.

At time T3, the active signal ACT provides an access request for an address R2. At time T4, in response to the S1 signal, the address R2 is captured and stored in the shift-register (FF signal), along with address R0. Because there was not an address R2 previously stored in the shift register, the S2 signal remains low. Between times T4 and T5, another refresh command AREF requests a refresh of address Rk+1, and address Rk+1 is provided as the refresh address on the RXADD signal.

At time T5, the active signal ACT provides an access request for an address R0. At time T6, in response to the S1 signal, the address R0 is captured and stored in the shift-register (FF signal). At time T7, in response to detecting a match between the address R0 received via the ACT signal and the address R0 previously stored in the shift register, the S2 signal transitions high, and the HITXADD1 signal is set to the address R0. The address scrambler 246 provides a first row hammer refresh address R0' on the HITXADD2 signal. At time T8, the INTERRUPT signal switches high, and in response, the RXADD signal provides the first row hammer refresh address R0' from the HITXADD2 signal as the address to be refreshed. Subsequently, at time T9, the address scrambler 246 provides a second row hammer refresh address R0" on the HITXADD2 signal. At time T10, the INTERRUPT signal switches high, and in response, the RXADD signal provides the second row hammer refresh address R0" to be refreshed from the HITXADD2 signal as the address to be refreshed.

In this manner, in the present embodiment, the access responding to the active signal ACT is intermittently monitored by using the first sampling signal S1; and, if occurrence of a predetermined times of access with respect to the same word line WL in a predetermined period of time is detected, the HITXADD1 address signal of the word line WL is latched by the latch circuit 245. The HITXADD1 address signal is converted to the HITXADD2 address signal by the address scrambler 246 and, in response to activation of the INTERRUPT signal, is supplied to the row decoder 112. As a result, the word line WL which is related to (mainly adjacent to) the word line WL' having a high access frequency is activated. Therefore, the memory cell MC, which may have critically decreased data retention characteristics due to a row hammer effect, can be additionally refreshed.

Figure 4A:
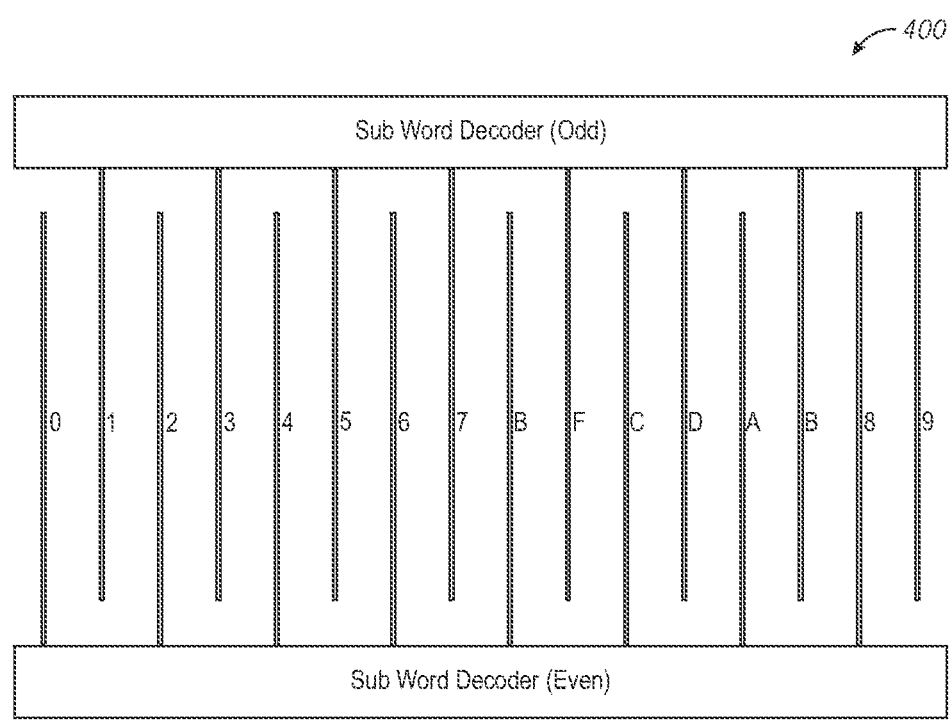
Figure 4B:
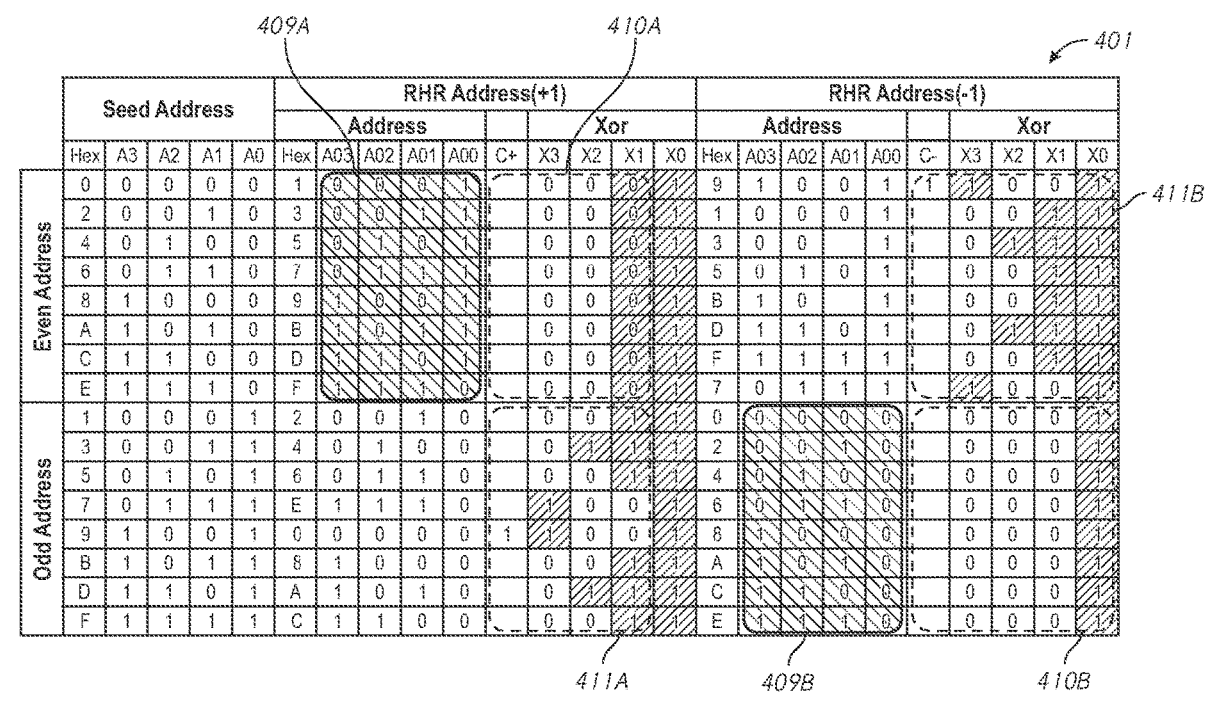

FIGS. 4A-4C are a block diagrams showing logical relationships between physical and logical addresses in accordance with an embodiment of the disclosure. In FIG. 4A, the graphic 400 shows that, in a sub-word line scrambler, the last four bits of every address could be used to classify and process every address using either an odd sub word decoder or an even sub-word decoder. The graphic 400 depicts 16 hex values 0-E, with each hex value coupled to one of the odd sub word decoder or the even sub-word decoder.

Referring to FIG. 4B, table 401 depicts logical relationships between four least significant bits A3:A0 of a seed address (e.g., the HITXADD1 address) and the four least significant bits AO3:AO0 of the adjacent row hammer addresses (e.g., the HITXADD2 address) that would be refreshed when a row hammer is detected. An adjacent row hammer address RHR+1 is shown in the RHR address (+1) section. The XOR section includes the values of X3:X0 bits that could be bitwise XOR'd with the corresponding seed address bits A3:A0 to determine the RHR+1 address AO3:AO0 for both even and odd seed addresses. An adjacent row hammer address RHR−1 is shown in the RHR address (−1) section. The XOR section includes the values of X3:X0 bits that could be bitwise XOR'd with the corresponding seed address bits A3:A0 to determine the RHR−1 address AO3:AO0 for both even and odd seed addresses. As shown in the table 401, for even seed addresses, all of the XOR values X3:X0 410A used to generate the RHR+1 address 409A are all 0001b. Additionally, for odd seed addresses, all of the XOR values X3:X0 410B used to generate the RHR−1 address 409B are 0001b. Therefore, no matter whether the seed address is even or odd, a first RHR address could be calculated using common logic that XORs the seed address with a 0001b.

The XOR values X3:X0 411B for the even RHR−1 addresses differ from the XOR values X3:X0 411A for the odd RHR+1 addresses. However, referring to FIG. 4C, using the tables and formulas shown in 402A-D, the XOR values may be determined using the seed address A3:A0 values. For example, the XOR X0 bit may be set to 1, as is shown in 402A. The XOR X1 bit may be calculated using the formula bit shown in 402B, which is set high when one of a bitwise XOR between A0, A1, and A3 is true OR a bitwise XOR between A1 and A2 is true. Otherwise, the X1 bit is set low. The XOR X2 bit may be calculated using the formula bit shown in 402C, which is set high when a bitwise XOR between A0, A1, and A3 is false and a bitwise XOR between A1 and A2 is true. Otherwise, the X2 bit is set low. The XOR X3 bit may be calculated using the formula bit shown in 402D, which is set high when a bitwise XOR between A0, A1, and A3 is false and a bitwise XOR between A1 and A2 is false. Otherwise, the X3 bit is set low.

Because the RHR+1 and RHR−1 addresses are determined using a subset of bits of a full address, the resultant addresses may run into an issue at certain boundary values. For example, at a seed address 0000b (0 hex), the RHR−1 address cannot be further reduced by one without involving a next (e.g., fifth) bit. Similarly, the address 1001b (9 hex) results in a value of RHR+1 address value of 0000b. To account for these special cases, the carry bits C+ and C− may be set. The carry bits may be used by downstream circuitry to determine the correct address value. While FIGS. A-4C shows 4 least significant bits of an address, more or fewer bits may be used to determine the XOR values and the RHR+1 and RHR−1 addresses.

Figure 5:
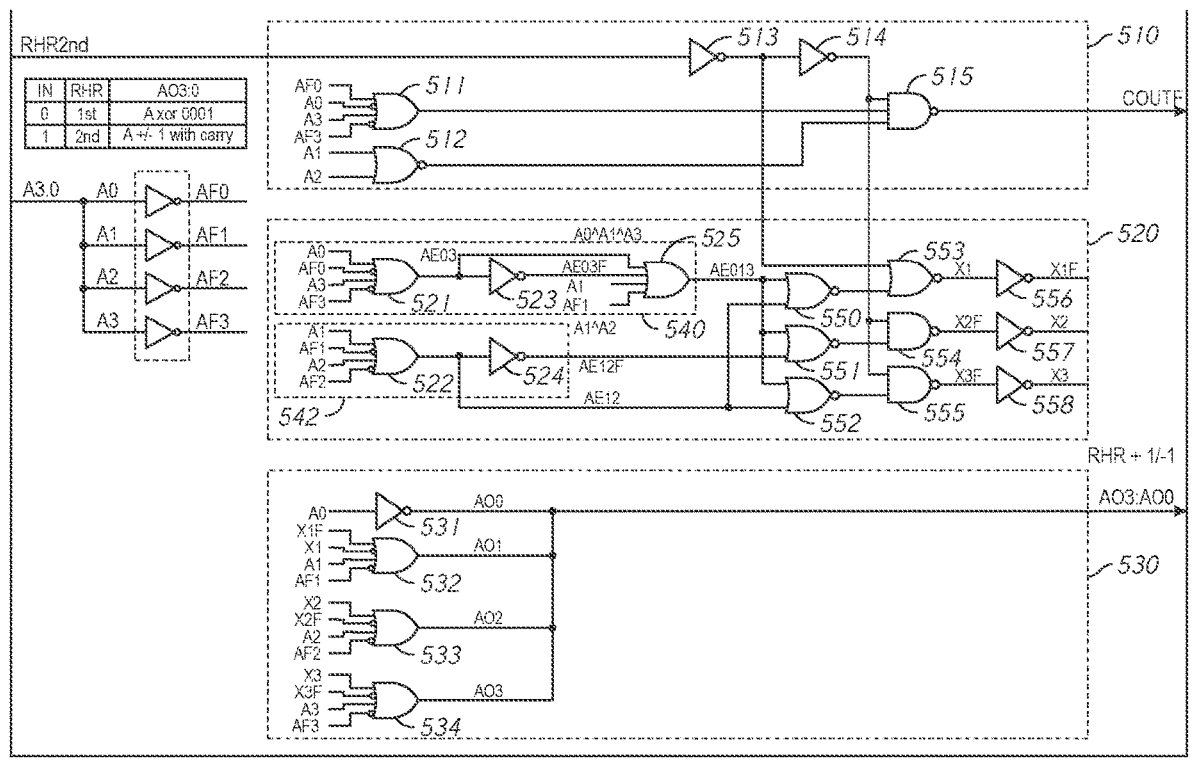
FIG. 5 is a circuit diagram showing a configuration of a sub-wordline (SWL) scrambler circuit of an address scrambler in accordance with some embodiments of the disclosure.

FIG. 5 is a circuit diagram showing a configuration of a sub-wordline (SWL) scrambler circuit 500 of an address scrambler in accordance with some embodiments of the disclosure. The address scrambler 246 of FIG. 2 may implement the SWL scrambler circuit 500. The portion of the address scrambler 500 receives a seed address A3:A0, calculates an inverted carry bit COUTF, the XOR bits X3:X1 (e.g., note that X0 is 1 in every example in the table 401 of FIG. 4B). Note that the address bits AF3:AF0 are the inverted seed address bits A3:A0, and X3F:X1F bits are the inverted X3:X1 bits.

As shown in FIG. 5, the SWL scrambler circuit 500 includes a carry bit circuit 510, an XOR bit circuit 520, and an address output circuit 530. The carry bit circuit 510 circuit is configured to calculate an inverted carry bit COUTF. The COUTF bit may correspond to the carry bits C+ and C− included in the table 401 of FIG. 4B. The carry bit circuit 510 includes an XOR logic gate 511, a NOR logic gate 512, an inverter 513, an inverter 514, and a NAND logic gate 515. The inverters 513 and 514 may drive a RHR second signal RHR2ND. The RHR2ND signal indicates whether a first RHR address (e.g., low logical values) or a second RHR address (e.g., high logical value) is being calculated. The XOR logic gate 511 performs a bitwise XOR operation on the inverted seed address bits A3 and A0. The NOR logic gate 512 performed a bitwise NOR operation on seed address bits A2 and A1. The NAND logic gate 515 performs a NAND operation on the output of the XOR logic gate 511, the NOR logic gate 512, and the RHR2ND signal (via the inverters 513 and 514).

The XOR bit circuit 520 includes a first logic circuit 540 configured to calculate the bitwise XOR operation on the seed address bits A3, A1, and A0 and a second logic circuit 542 configured to perform the bitwise XOR operation on the seed address bits A2 and A1, as used in the formulas shown in 402B, 402C, and 402D of FIG. 4C. The first logic circuit 540 includes an XOR logic gate 521 that performs a bitwise XOR operation on the seed address bits A3 and A0 to provide the AE03 signal and an XOR logic gate 525 that performs a bitwise XOR operation on the seed address bit A1 and the output AE03 signal of the 523 to provide to the AE013 signal. The first logic circuit 540 also includes inverter 523 that inverts the output AE03 signal of the XOR logic gate 521 to provide the AE03F signal. The second logic circuit 542 includes an XOR logic gate 522 that performs a bitwise XOR operation on the seed address bits A2 and A1 to provide the AE12 signal and an inverter 524 that inverts the output AE12 signal of the XOR logic gate 522 to provide the AE12F signal.

The XOR bit circuit 520 further includes NOR gates 550, 551, and 552 that are configured to perform NOR operations on combinations of the AE013 and AE12/AE12F signals. The NOR gate 550 is configured to perform a NOR operation on the AE013 signal and the AE12 signal. The NOR gate 551 is configured to perform a NOR operation on the AE013 signal and the AE12F signal. The NOR gate 552 is configured to perform a NOR operation on the AE013 signal and the AE12 signal.

The XOR bit circuit 520 further includes NOR gate 553 and NAND gates 554 and 555, which may pass through the outputs of the NOR gates 550, 551, and 552 when the RHR2ND signal indicates the second RHR address and block the outputs of the NOR gates 550, 551, and 552 when the RHR2ND signal indicates the first RHR address. The output of the NOR gate 553 provides the X1 signal and an inverted X1 signal X1F via the inverter 556. The output of the NAND gate 554 provides the X2 signal via the inverter 557. The output of the NAND gate 555 provides the X3 signal via the inverter 558.

The address output circuit 530 performs the XOR operation on the XOR bits X3:X0 and the seed address bits A3:A0 to provide the AO3:AO0 bits. The address output circuit 530 includes a 531 that inverts the A0 bit to provide the AO0 bit (e.g., logically equivalent to an XOR operation on X0 (which is equal to 1) and the A0 bit). The address output circuit 530 further includes XOR gates 532, 533, and 534 which bitwise XOR the A1 and X1, A2 and X2, and A3 and X3 bits, respectively, to provide the AO1, AO2, and AO3 bits, respectively.

The SWL scrambler circuit 500 is an exemplary implementation of an address scrambler, and other logic circuits could be implemented without departing from the scope of the disclosure.

Figure 6:
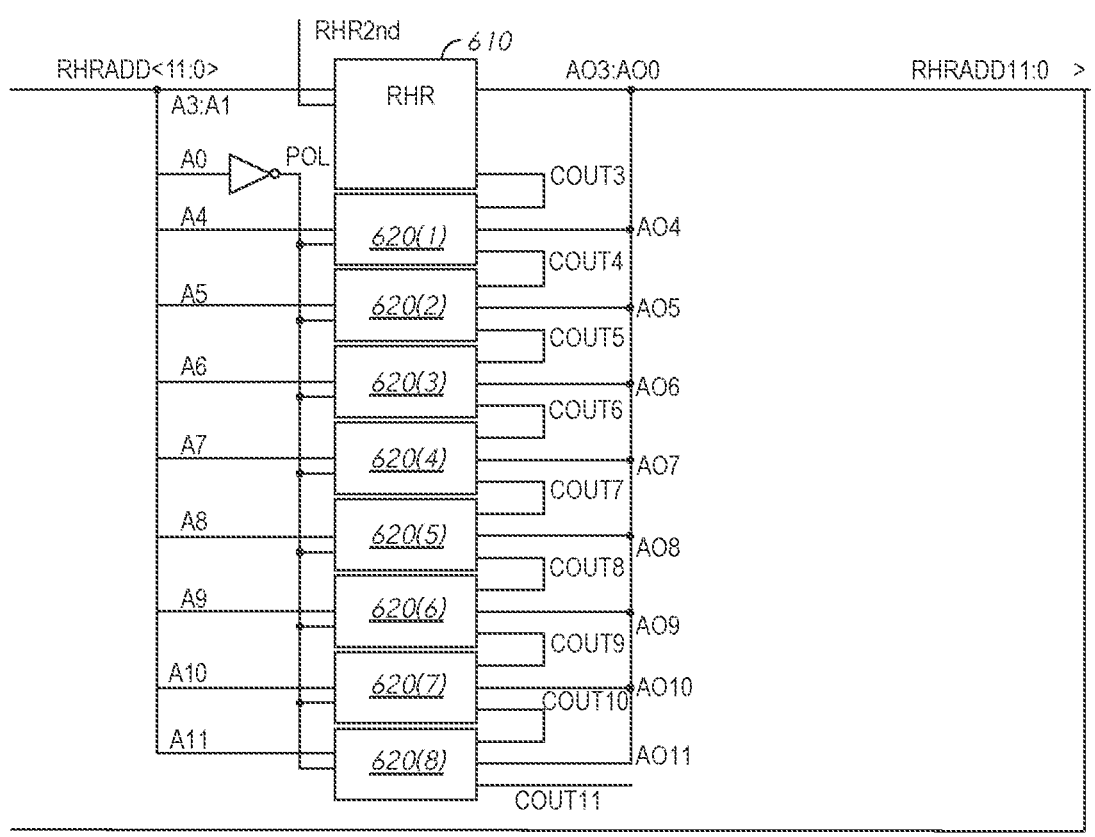
FIG. 6 is a circuit diagram showing a configuration of an address scrambler circuit in accordance with some embodiments of the disclosure.

FIG. 6 is a circuit diagram showing a configuration of an address scrambler circuit 600 in accordance with some embodiments of the disclosure. The address scrambler 246 of FIG. 2 may implement the address scrambler 600. The address scrambler 600 receives the HIT_XADD address A11:A0 and a RHR address HITXADD2 address AO11:AO0. The address scrambler 600 includes an SWL scrambler circuit 610 that provides the AO3:AO0 address bits and a series of row hammer count circuits 620(7)-620(1) that provide the AO11:AO4 address bits, respectively. The SWL scrambler circuit 610 may implement the SWL scrambler circuit 500 of FIG. 5 to provide the AO3:AO0 bits and the carry bit C based on the A3:A0 address bits.

The row hammer count circuits 620(8)-620(1) may each receive a respective address bit A11:A4; a carry out bit from a preceding one of the row hammer count circuits 620(6)-620(1), with the row hammer count circuit 620(1) receiving the carry bit C from the SWL scrambler circuit 610; and an inverted A0 bit (via the inverter 630) as a polarity bit used to indicate addition or subtraction. Each of the row hammer count circuits 620(8)-620(1) may calculated a respective one of the AO11:AO4 signals based on the received input signals.

Figure 7:
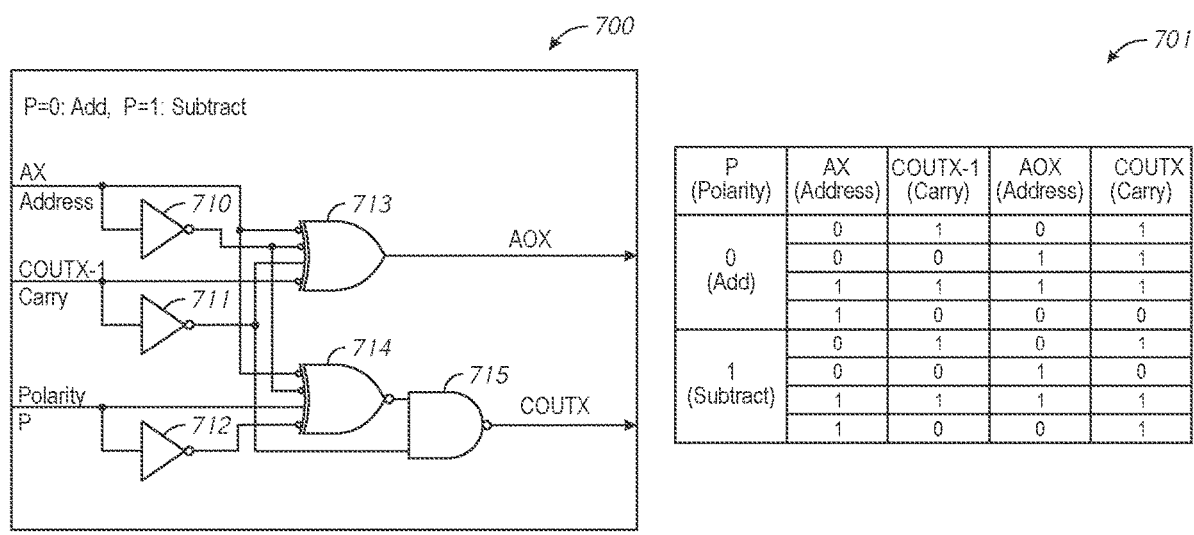
FIG. 7 is a circuit diagram showing a configuration of a row hammer count circuit in accordance with some embodiments of the disclosure.

For example, FIG. 7 is a circuit diagram showing a configuration of a row hammer count circuit 700 used to calculate an address output bit AOX based on an address bit AX, a carry out bit COUTX-1 from a previous RH counter or SWL scrambler circuit, and a polarity bit, where X is an integer from 4 to 11, in accordance with some embodiments of the disclosure. The row hammer count circuit 700 includes an XOR logic gate 713 configured to receive the address bit AX and the carry out COUTX-1 bit (and inverted AX bit via inverter 710 and inverted COUTX-1 bit via inverter 711) to provide the address output bit AOX using XOR logic. The row hammer count circuit 700 further includes an XOR logic gate 714 configured to receive the polarity bit and the carry out COUTX-1 bit (and inverted polarity bit via inverter 712 and inverted COUTX-1 bit via inverter 711) to provide an input to a NAND logic gate 715 using XOR logic. The NAND logic gate 715 may use NAND logic on the output of the XOR logic gate 714 and the inverted COUTX-1 bit to provide the COUTX bit. The table 701 depicts logical combinations of the AX, COUTX-1, and polarity bits, and resultant AOX and COUTX bits.

Turning back to FIG. 6, the output address bits AO11:AO0 may be provided to downstream circuitry as the RHRADD11:0 for refresh to mitigate effects from a row hammer attack. The logic circuits depicted in FIGS. 6 and 7 are exemplary and other logic circuits could be implemented without departing from the scope of the disclosure.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying mode of the disclosed disclosure. Thus, it is intended that the scope of at least some of the present disclosure herein disclosed should not be limited by the particular disclosed embodiments described above.

What is claimed is:

1. An apparatus comprising:
   a refresh address control circuit comprising:
   a shift register configured to store a plurality of previously-sampled row addresses corresponding to respective rows of memory cells and to receive a new sample row address corresponding to a first row of memory cells, wherein, in response to a sampling signal, the shift register is configured to provide an indication of a row hammer attack in response to detection of a match between the new sample row address and one of the plurality of previously-sampled row addresses; and
   an address scrambler circuit configured to receive the indication of the row hammer attack and the new sample row address, wherein the address scrambler circuit is further configured to perform first and second sets of logical operations on a first subset of bits of the new sample row address to provide a first subset of bits of a victim row address corresponding to a second row of memory cells physically adjacent to the first row of memory cells, wherein the address scrambler circuit is configured to perform bitwise exclusive OR operations as part of the first or second sets of logical operations.

2. The apparatus of claim 1, wherein the address scrambler circuit is further configured to perform the first and second sets of logical operations on the first subset of bits of the new sample row address to provide a second subset of bits of a second victim row address corresponding to a third row of memory cells physically adjacent to the first row of memory cells.

3. The apparatus of claim 1, wherein the address scrambler circuit is configured to perform the first set of logical operations by performing bitwise comparisons between a set of three bits of the first subset of bits and bitwise comparisons between a set of two bits of the first subset of bits.

4. The apparatus of claim 3, wherein the set of three bits of the first subset of bits partially overlaps with the set of two bits of the first subset of bits.

5. The apparatus of claim 1, wherein the address scrambler circuit is further configured to determine a second subset of bits of the victim row address based on a second subset of bits of the new sample row address.

6. The apparatus of claim 5, wherein the address scrambler circuit is further configured to determine a carry bit based on the first subset of bits of the new sample row address and is configured to determine the second subset of bits of the victim row address further based on the carry bit.

7. The apparatus of claim 5, wherein the address scrambler circuit is further configured to determine a polarity bit based on a first bit of the first subset of bits of the new sample row address and is configured to determine the second subset of bits of the victim row address further based on the polarity bit.

8. The apparatus of claim 1, wherein the shift register comprises a plurality of sets of flip-flops each configured to store respective one of the plurality of previously-sampled row addresses.

9. The apparatus of claim 8, wherein a first set of flip-flops of the plurality of sets of flip-flops is configured to store an output of a second set of flip-flops of the plurality of sets of flip-flops in response to the sampling signal.

10. A method comprising:
    in response to a sampling signal, providing an indication of a row hammer attack in response to detection of a match between the new sample row address and one of a plurality of previously-sampled row addresses; and
    in response to the indication of the row hammer attack:
        performing first and second sets of logical operations on a first subset of bits of the new sample row address to provide a subset of bits of a victim row address corresponding to a second row of memory cells physically adjacent to the first row of memory cells; and
        determining a second subset of bits of the victim row address based on a second subset of bits of the new sample row address.

11. The method of claim 10, further comprising performing the first and second sets of logical operations on the first subset of bits of the new sample row address to provide a second subset of bits of a second victim row address corresponding to a third row of memory cells physically adjacent to the first row of memory cells.

12. The method of claim 10, further comprising performing bitwise exclusive OR operations as part of the first or second sets of logical operations.

13. The method of claim 10, further comprising performing the first set of logical operations performed by performing bitwise comparisons between a set of three bits of the first subset of bits and bitwise comparisons between a set of two bits of the first subset of bits.

14. The method of claim 13, wherein the set of three bits of the first subset of bits partially overlaps with the set of two bits of the first subset of bits.

15. The method of claim 10, further comprising:
    determining a carry bit based on the subset of bits of the new sample row address; and
    determining the second subset of bits of the victim row address further based on the carry bit.

16. The method of claim 10, further comprising:
    determining a polarity bit based on a first bit of the subset of bits of the new sample row address; and
    determining the second subset of bits of the victim row address further based on the polarity bit.

17. The method of claim 10, further comprising storing each of the plurality of previously-sampled row addresses via respective set of a plurality of sets of flip-flops.

18. The method of claim 10, wherein the first and second logical operations include common logical operations.

* * * * *